United States Patent [19]

Cannella

[11] Patent Number: 4,889,609
[45] Date of Patent: Dec. 26, 1989

[54] CONTINUOUS DRY ETCHING SYSTEM

[75] Inventor: Vincent D. Cannella, Birmingham, Mich.

[73] Assignee: Ovonic Imaging Systems, Inc., Troy, Mich.

[21] Appl. No.: 240,861

[22] Filed: Sep. 6, 1988

[51] Int. Cl.[4] .......................... C23C 14/56; C23F 1/02
[52] U.S. Cl. ..................................... 204/298; 156/345
[58] Field of Search ................... 204/192.32, 298 EM, 204/298 MC; 156/345, 643

[56] References Cited
U.S. PATENT DOCUMENTS 4,587,002 5/1986 Bok ....................................... 204/298
4,816,638 3/1989 Ukai et al. ...................... 219/121.43

Primary Examiner—Aaron Weisstuch
Attorney, Agent, or Firm—Marvin S. Siskind; Richard M. Goldman; Kenneth M. Massaroni

[57] ABSTRACT

A system and method for dry etching an etchable material from a substrate, are disclosed. The system includes an etching chamber including means for establishing a dry etching process therein, a substrate chamber for storing the substrate, and transport means for advancing the substrate from the substrate chamber to the etching chamber. First coupling means couple the interior of the substrate chamber to the interior of the etching chamber to provide an opened passageway therebetween during the etching process. The transport means preferably continuously advances the substrate from the substrate chamber to the etching chamber. Also disclosed are means for maintaining unidirectional gas flow from the substrate chamber to the etching chamber to isolate the etching process from the substrate chamber.

16 Claims, 4 Drawing Sheets

CONTINUOUS DRY ETCHING SYSTEM

BACKGROUND OF THE INVENTION

The present invention generally relates to a system and method for dry etching an etchable material from a substrate. The present invention more particularly relates to such a system and method wherein the substrate is transported, preferably continuously, through a plurality of chambers, wherein one of the chambers is a dry etching chamber dedicated to anisotropically etching the etchable material from the substrate, and wherein the environment within the etching chamber is isolated from immediately adjacent load and unload chambers by the maintenance of unidirectional gas flow from the adjacent chambers into the etching chamber. The present invention is particularly useful in the manufacture of large area active matrices, such as liquid crystal displays and imagers, of the type which employ a plurality of active electronic devices distributed throughout the matrix.

Amorphous silicon alloys have demonstrated a suitability for many electronic applications. Two such applications are, for example, large area active matrices of the type found in liquid crystal displays and in matrix-addressed line or two dimensional imagers. In such displays and imagers, active elements, such as PIN diodes, nonlinear switching elements, or thin film field effect transistors are associated with each display pixel or image photosensor to provide isolation between the pixels or photosensors and thus permit selective application of activating driving or charging potentials to each pixel or photosensor without the inadvertent activation of other pixels or photosensors. These amorphous silicon alloys may be made using known techniques in multiple layers successively deposited on top of the other, using plasma-assisted chemical vapor deposition (i.e., RF glow discharge) in the manner described in U.S. Pat. Nos. 4,217,374 , 4,226,898, and 4,342,044 which are hereby incorporated herein by reference.

Amorphous silicon alloys are particularly well suited for use in large area active matrices because the amorphous semiconductor alloys can be deposited as thin films over large substrate areas. High quality and virtually defect free amorphous semiconductor thin films can be formed and later selectively etched to leave discrete devices such as the aforementioned PIN diodes on the substrate. In one prior process, a top layer of metal is deposited on top of the layers of amorphous semiconductor films, and then it is patterned using conventional photoresist mask and etching techniques. Thereafter, the amorphous semiconductor films may be plasma etched using the patterned top metal layer itself as a mask, which leaves the discrete devices only under the locations where the patterned top metal remained. The devices or diodes can thereafter be connected to their respective pixel electrodes during a metallization step.

Various dry etching processes have been used or may be adapted to be used to selectively etch deposited thin films of metal, insulators, semiconductors, or combinations thereof. Well-known dry etching processes include glow discharge methods such as plasma etching, reactive ion etching (RIE) and sputter etching, and wide-area ion beam-based methods such as ion milling, chemically assisted ion milling, and reactive ion beam etching (RIBE). All of these processes use one or more process gases and all produce gaseous etch products as the material to be etched is etched from the substrate in the etching chamber. The etch products may be involatile or volatile, depending upon the material being etched and the specific process and process gases being used. Involatile etch products, and to a lesser extent volatile etch products, tend to collect or condense on surfaces within the etching chamber including the substrate. Accordingly, it is preferable to continuously remove such etch products from the etching chamber to avoid contamination of the substrate.

In glow discharge sputtering and in ion milling, the process gas or gases are typically inert (e.g., argon), and the etching is accomplished principally if not entirely by the physical abrasion and erosion of the etchable material by energetic gas molecules or ions. In plasma etching, RIE, chemically assisted ion milling, and RIBE, at least one of the process gases used is reactive. Typical reactive gases include $CF_4$, $Cl_2$, and $XeF_2$. Accordingly, these later four processes are either partially or completely chemically assisted or driven. When using any of these reactive gas-based dry etching methods, the length of time activated ion species are in contact with the material to be selectively etched must be carefully controlled, as must the relative concentration of such species, to obtain the desired etching results. There are advantages and drawbacks associated with each of various methods which may be used to etch different types of thin film materials, which render certain of these methods more suitable than others for particular types of materials or structures to be selectively etched in order to form various microelectronic structures. A discussion of such advantages and drawbacks, and a further description of the aforementioned dry etching methods is provided in J. W. Coburn, "Pattern Transfer", *Solid State Technology*, (April, 1986), pp. 117–122.

Dry anisotropic etching processes are becoming increasingly popular because of the need for more sharply defined and densely packed features and devices in modern microelectronic structures of all types. One such anisotropic etching process which is now in wide use is reactive ion etching. The assignee of the present invention has found that reactive ion etching is particularly suitable for selectively etching deposited thin film structures including one or more layers of amorphous silicon alloy semiconductor material. For the purpose of the present disclosure RIE may be considered exemplary of the various dry etching methods.

In such a reactive ion etching process, a substrate having the deposited thin films thereon is loaded into an etching chamber. Within the etching chamber is a main electrode to which radio frequency energy is applied and a counter electrode spaced from the main electrode. The substrate is placed immediately adjacent the main electrode between the main electrode and the counter electrode. An etching process gas suitable for etching the metals, insulators, or semiconductor materials to be etched is then fed into the chamber. The radio frequency energy causes a plasma to be formed from the etching process gas which disassociates into a number of active species including usually both negative and positive ions. For example, where the etching gas is comprised of carbon tetrafluoride ($CF_4$), negative fluorine ions and positive C, CF, $CF_2$, and $CF_3$ ions are formed in the plasma. Because the negative fluorine ions are lighter and more mobile than the positive ions, the main electrode develops a negative charge. This causes the positive ions to be accelerated towards the main electrode and bombard the substrate. As a result, the impinging positive ions etch the exposed areas of the thin films deposited on the substrate. Reactive ion etching is desirable because it is a dry and anisotropic process wherein the remaining thin film portions are well defined with minimum under-cutting.

In U.S. Pat. No. 4,680,085 issued July 14, 1987 in the names of M. Vijan, J. McGill, and P. Day, and entitled Method Of Forming Thin Film Semiconductor Devices, which is hereby incorporated herein by reference, there are disclosed preferred methods for reactive ion etching thin film metal and semiconductor layers, such as a amorphous semiconductor current-control devices like PIN diodes, NIN or N-pi-N nonlinear switches and the like, to form mesa-like semiconductor structures having substantially vertical sidewalls free of overhangs or under-cutting and voids. One such preferred method for the reactive ion etching of multiple layers of amorphous silicon alloy of different conductivity types to form current control devices such as a-Si:H PIN diodes involves the use of a pure $CF_4$ process gas substantially free of all $O_2$ in a reaction chamber which has been purged with an inert gas plasma to eliminate any residual oxygen or water before beginning the reactive ion etching step. Specific process parameters for carrying out the preferred reactive ion etching method to etch such multiple layers are disclosed in the aforementioned application, and may be profitably employed to best utilize the apparatus of the present invention and to practice the methods of the present invention on such amorphous silicon alloy layers.

While dry etching processes such as reactive ion etching have proven desirable, they have heretofore suffered some drawbacks when incorporated into commercial high volume processes. For example, two dimensional etching uniformity across the substrate is essential and has been difficult to obtain on large area substrates, e.g., 4 inch by 6 inches, 7 by 11 inch, or 12 by 12 inch substrates. This problem will be magnified when attempting to etch even larger substrates such as those which will likely be used in the not-too-distant future to make flat panel liquid crystal television sets having a diagonal dimension of 19 inches, 25 inches or more. In addition, throughput has also been a problem because, in the past, separate processing of each substrate using batch processing equipment with load-lock chambers has been required. The opening and closing of the load-locks, the pumping down of the chambers, and re-establishment of the etching plasma with every new substrate or batch of substrates placed in the etching chamber requires extra processing time, which is a very important consideration in commerical applications.

In short, the dry etching art, including the reactive ion etching art, has not kept pace with the art of depositing amorphous semiconductor thin films wherein such semiconductor thin films can now be deposited by continuous processes. A continuous dry etching process would be advantageous because it would not require two dimensional uniformity, since spatial uniformity in the direction of substrate movement would be essentially inherent or automatic under a continuously maintained and stable etching process. Thus only spatial uniformity in the direction transverse to substrate movement need be considered. Thus, for example, spatial uniformity across the rectangular substrate of a 19 inch or 25 inch diagonal liquid crystal television display would only have to be maintained across the width of the substrate. Continuous dry etch processing such as reactive ion etching would also be advantageous since it would lend itself to high volume mass production of large area substrates and, unlike present batch dry etching systems and methods (such as RIE batch systems and methods), would be better able to keep up with processing throughput demands imposed by the continuous deposition systems which deposit the high quality amorphous semiconductor thin films and metals to be etched.

The topic of providing a continuous dry etch system or method for etching etchable material such as semiconductor thin films on substrates has apparently not been addressed by those in the art. One possible reason for this is that any such system or method used in conjunction with a semiconductor deposition system must strictly avoid contamination of the semiconductor deposition system by the etching system.

The field of thin film deposition systems and methods is quite distinct and different from the field of dry etching systems, even though both employ plasma systems and vacuum technology, since one field is devoted to depositing materials, while the other field is devoted to removing materials, and the processes, chemistry, and process parameters differ tremendously. In the thin film deposition field, the present inventor and others affiliated with the assignee of the present invention have developed systems, methods and devices for depositing amorphous silicon alloys in high volume continuous processing systems for photovoltaic uses. Systems of this kind are disclosed for example in U.S. Pat. No. 4,400,409 issued Aug. 23, 1983, for A Method Of Making P-doped Silicon Films, U.S. Pat. No. 4,542,711 issued Sept. 24, 1985, for Continuous Systems For Depositing Amorphous Semiconductor Material, and U.S. Pat. No. 4,410,558 issued Oct. 18, 1983, for Continuous Amorphous Solar Cell Production System. As disclosed in these three patents, which are hereby incorporated herein by reference, a substrate is continuously advanced through a succession of deposition chambers with each chamber being dedicated to the deposition of a specific type of material. In making a solar cell of PIN configuration, for example, a first chamber is dedicated for depositing a p-type amorphous silicon alloy, a second chamber is dedicated for depositing an intrinsic amorphous silicon alloy, and a third chamber is dedicated for depositing an n-type amorphous silicon alloy. In order to make such a solar cell of maximum efficiency, each deposited alloy, and especially the intrinsic alloy, must be of high purity. As a result, it is necessary in such systems to isolate the deposition environment in the intrinsic deposition chamber from the doping constituents within the other chambers to prevent the diffusion of doping constituents into the intrinsic chamber. In the systems disclosed in the aforementioned patents, such isolation between the chambers is accomplished with gas gates which pass an inert gas over the substrate as it passes from one chamber to the next.

An improvement to the systems disclosed in the above-mentioned patents is disclosed in U.S. Pat. No. 4,438,723 issued Mar. 27, 1984, for Multiple Chamber Deposition and Isolation System and Method, which is hereby incorporated herein by reference. In the continuous processing system disclosed in this patent, the deposition environment within the intrinsic amorphous silicon alloy deposition chamber is isolated from the deposition environments within the doped amorphous silicon alloy deposition chambers adjacent thereto by the maintenance of unidirectional gas flow from the intrinsic deposition chamber into the chambers adjacent thereto. As disclosed, it is preferred that the unidirectional gas flow be maintained through the gas gates through which the substrate is transported from one chamber to the next.

The references relating to the production of photovoltaic devices such as solar cells do not disclose or suggest how to adapt the systems or methods taught therein to dry etching of etchable materials such as layers of amorphous semiconductor alloy thin films from substrates.

SUMMARY OF THE INVENTION

The present invention provides a high throughput system for dry etching an etchable material from a substrate. High throughput is achieved by eliminating the load lock mechanism traditionally used between the etching chamber and load/unload chamber in conventional etching systems. This eliminates the need for all sequencing steps associated with the opening and closing of such load-lock mechanism, such as pump-down and re-establishment of the etching plasma, with every substrate placed in the etching chamber. The elimination of the traditional load lock mechanism separating the load/unload chamber from the etching chamber is made possible in the present invention by the use of first and second coupling means for interconnecting the etching chamber to the load chamber and unload chamber respectively, and means for maintaining unidirectional gas flow from the load chamber to the etching chamber and also from the unload chamber to the etching chamber. These coupling means, which are often called gas gates, each include an opening of selected length and cross-sectional area through which the substrate or substrates to be etched may be passed. During the etching process, these gas gates remain open and a continuous unidirectional flow of gas is established therethrough at a rate sufficient to substantially reduce diffusion of at least certain undesired gases or gas products present in the etching chamber to either the load or unload chamber. Specifically, the unidirectional gas flow can be established in a manner which prevents reactive process gas species or etch products (i.e., the effluent from the dry etching process) or both from diffusing into either the load chamber or unload chamber in quantities sufficient to adversely affect the substrates or microelectronic structures held therein.

In the dry etching system of the present invention, the degree of isolation required to be maintained across the gas gates will vary depending on a number of factors such as the particular dry etch process to be carried out in the etching chamber, the type of process gases used, whether reactive species are formed during the etching process and if so at what rate, the type of etch products formed and whether they are volatile or nonvolatile, and the sensitivity of the structures being held in the load or unload chamber to contamination or attack by etch products and reactive species. In general, in order to avoid undesired contamination, some degree of isolation is required even if the process gas should happen to be inert and the etch product involatile, since the etch product given sufficient time and/or diffusion rates, would build up on substrates being held in the load and unload chambers. Similarly, volatile etch products or reactive process gas species in a dry etching process generating or using same will, given sufficient time and/or diffusion rates, attack or otherwise contaminate microelectronic structures held in the load or unload chamber. The various embodiments of the dry etching system of the present invention are operable in a manner to provide a wide range of degrees of isolation simply by adjusting the flow rates of gases supplied to and operating pressures maintained in the load, etching and unload chambers.

In one particularly preferred embodiment, etching process gas or gases used for forming various reactive ion species are supplied to the load and unload chamber, rather than directly to the etching chamber itself. The etching chamber is maintained at a lower pressure than the load and unload chambers so that the process gas is swept into the etching chamber through the connecting gas gates, thereby allowing the process gas to also serve as the sweep gas that provides the desired isolation between chambers. This embodiment has the distinct advantage of minimizing the number of different gases which need be supplied to the system, which greatly simplifies process control and enhances etching uniformity.

In another embodiment, a single vacuum pump, connected to the etching chamber during the etching operation, is provided to maintain both the desired unidirectional gas flow through the gas gates and desired pressure in the etching chamber during the etching operation. In the preferred embodiments, several substrates are moved continously and in succession from the load chamber, into and through the etching chamber, to the unload chamber, thereby automatically providing uniform etching of the substrates in a direction of substrate movement.

The present invention provides a system for etching an etchable material from a substrate. The system includes an etching chamber including means for establishing a dry etching process therein for dry etching the etchable material from the substrate, a substrate chamber including means for storing the substrate, and first coupling means for coupling the interior of the substrate chamber with the interior of the etching chamber to provide a passageway therebetween arranged to remain open during the dry etching of the etchable material from the substrate. Transport means advance the substrate from the substrate chamber into the etching chamber through the first coupling means.

In accordance with at least one preferred embodiment, the means for establishing the dry etching process includes means for establishing the process from at least a first gas, the first gas being an etching process gas, the substrate chamber is a substrate load chamber including means for receiving at least a second gas, and the system further includes a substrate unload chamber including means for receiving at least a third gas, second coupling means for coupling the unload chamber to the etching chamber, and means for maintaining unidirectional gas flow through the coupling means of the second and third gases from the load chamber to the etching chamber and from the unload chamber to the etching chamber. The transport means are arranged for advancing the substrate through the first coupling means from the load chamber into the etching chamber to permit the dry etching process to etch the etchable material and for advancing the substrate through the second coupling means from the etching chamber to the unload chamber after the etchable material has been etched from said substrate. Preferably, at least one of the second or third gas is the etching process gas and alternatively, both the second and third gases are the etching process gas.

Preferably, the transport means are arranged for continuously advancing the substrate from the load chamber into the etching chamber to permit said dry etching process to etch the etchable material and for continuously advancing the substrate from the etching chamber to the unload chamber after the etchable material has been etched from the substrate. The etching chamber can include means for establishing a glow discharge based dry etching process selected from the group consisting of plasma etching, reactive ion etching, and sputter etching or an ion-beam based dry etching process selected from the group consisting of ion milling, chemically assisted ion milling, and reactive ion beam etching.

The present invention further provides a method of etching an etchable material from a substrate. The method includes the steps of providing a load chamber, an etching chamber, and an unload chamber, communicating the chambers together in series relation, and forming at least one etching species within the etching chamber from at least a first gas, the first gas being an etching process gas. The method further includes feeding at least a second gas into the load chamber and at least a third gas into the unload chamber. The method further includes transporting the substrate from the load chamber to the etching chamber through the first coupling means and from the etching chamber to the unload chamber through the second coupling means, and maintaining unidirectional gas flow from the load chamber into the etching chamber through the first coupling means and from the unload chamber into the etching chamber through the second coupling means. Preferably, at least one of the second or third gas is the etching process gas.

The reactive ion etching systems and methods of the present invention may be used to perform one or more of the etching steps required to fabricate many different types of microelectronic circuit and device structures traditionally formed on crystalline wafers using conventional crystalline processing techniques or on alternative substrates such as glass, (e.g., Corning 7059 plates), stainless steel, polyimide, or oxidecoated metal sheet such as aluminum and the like, using thin film deposition and processing techniques. By way of illustration and not limitation, exemplary microelectronic structures which during their fabrication may profitably employ the etching system and method of the present invention to perform one or more required etching steps include the active matrix flat panel display electronic structures and circuit devices disclosed in U.S. patent applications Ser. No. 573,004 filed Jan. 23, 1984 for Liquid Crystal Displays Operated By Amorphous Silicon Alloy Diodes, now abandoned, and Pat. No. 4,698,627 issued Oct. 6, 1987 for Programmable Semiconductor Switch For A Display Matrix Or The Like And Method For Making Same, and matrix-addressable imaging devices disclosed in U.S. Pat. No. 4,675,739 issued June 23, 1987 for Integrated Radiation Sensing Array, which applications are hereby incorporated herein by reference.

DETAILED DESCRIPTION

Figure 1:
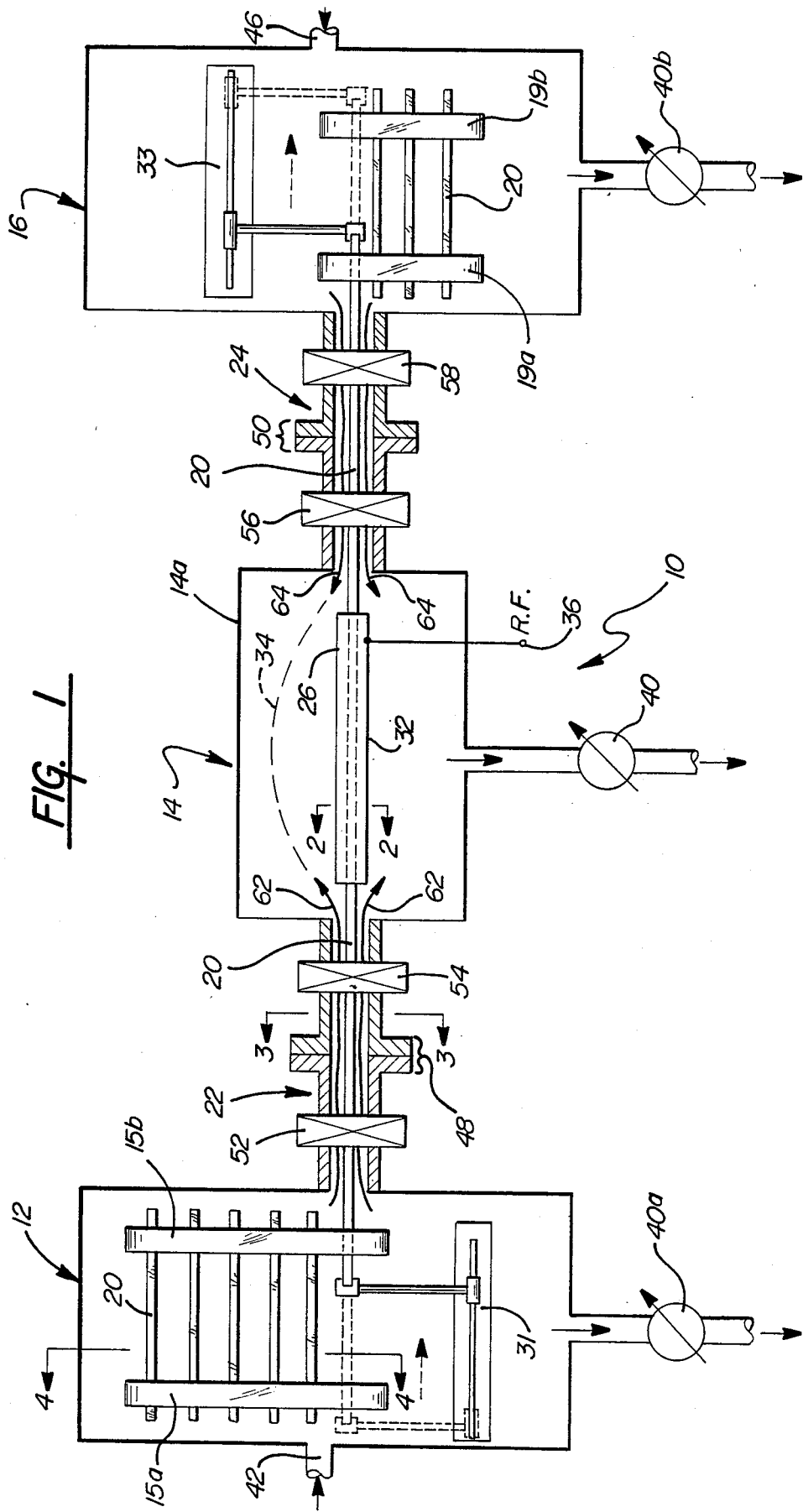
FIG. 1 is a generally schematic side view of a continuous reaction ion etching system embodying the present invention.

Referring now to FIG. 1, it illustrates a continuous processing system 10 which embodies the present invention. The system 10 is adapted for etching an etchable material such as one or more layers of amorphous semiconductor alloy thin films from each of a plurality of substrates which are transported in a continuous manner through an etching chamber. The system 10 generally includes a load chamber 12, an etching chamber 14, and an unload chamber 16. The load chamber 12 is adapted for temporarily storing a plurality of substrates 20 upon which one or more layers of semiconductor material such as amorphous semiconductor alloy material have been deposited. Over the semiconductor thin films is formed a layer of photoresist which has been previously exposed and developed using any conventional or suitable techniques in order to expose selected portions of the semiconductor thin films to be selectively etched away. The etching chamber 14 is adapted to provide a dry etching process therein for dry etching the exposed areas of the semiconductor thin films. Such dry etching processes can include glow discharge based dry etching processes such as plasma etching, reactive ion etching, and sputter etching, or ion-beam based dry etching processes such as ion milling, chemically assisted ion milling, and reactive-ion beam etching. In accordance with this preferred embodiment, the etching chamber 14, as will be described subsequently, includes means for establishing a reactive ion etching process therein. Lastly, the unload chamber 16 is adapted for receiving and collecting the substrates 20 after the etching step has been completed in the etching chamber 14.

The chambers 12, 14, and 16 are coupled together in a series arrangement by a plurality of coupling means which include a gas gate 22 which couples the load chamber 12 to the etching chamber 14 and a gas gate 24 which couples the etching chamber 14 to the unload chamber 16. Both of the gas gates 22 and 24 are dimensioned to permit the substrates 20 to pass therethrough as illustrated in FIG. 1 and are transported from one chamber to the next continuously and in succession. As will be described more completely hereinafter, the gas gates 22 and 24 are also dimensioned for conducting gas flow therethrough to provide effective isolation between the chambers of the system.

Figure 4:
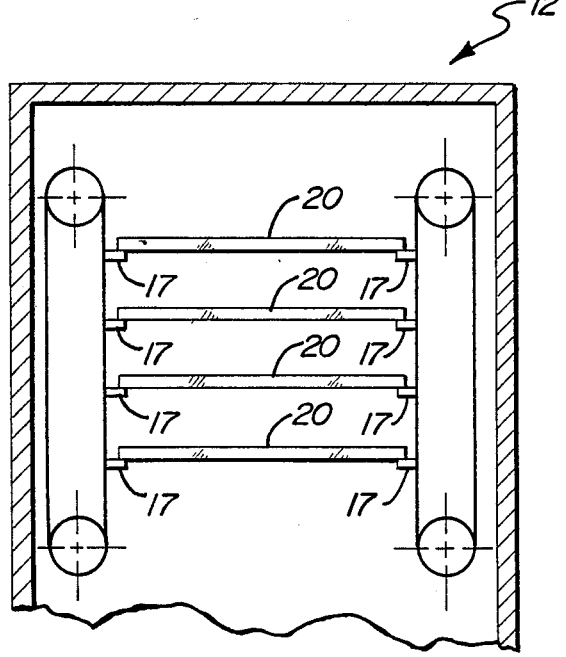
FIG. 4 is a cross-sectional view taken along lines 4—4 of FIG. 1.

As can be best seen in FIGS. 1 and 4, the load chamber 12 includes two pairs of belts 15a and 15b, each pair having a plurality of stops or sprockets 17 projecting inwardly towards each other. The sprockets are spaced apart so that the substrates 20 to be processed can be supported by the sprockets in substantially parallel relation and substantially horizontally. As will be described subsequently, the substrates are advanced from the load chamber 12 into the etching chamber 14 one at a time in succession. After a substrate has been so advanced, the belts 15a and 15b move the sprockets downwardly so that the next substrate to be advanced is in proper position for advancement. Similarly, the unload chamber 16 includes two pairs of belts 19a and 19b which also have a plurality of sprockets (not shown) thereon. After a newly processed substrate is received within the unload chamber 16, the belts are moved to displace the substrates downwardly to provide a space for the next substrate to be received.

Figure 2:
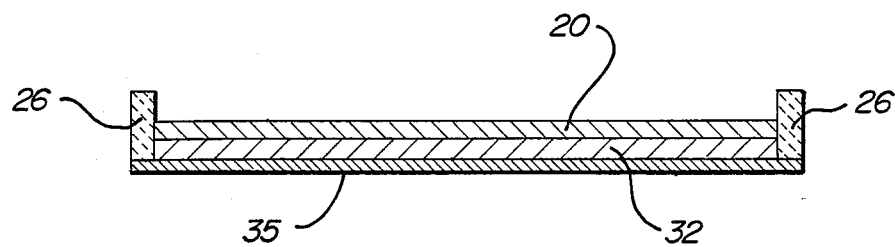
FIG. 2 is a cross-sectional view taken along lines 2—2 of FIG. 1.
Figure 3:
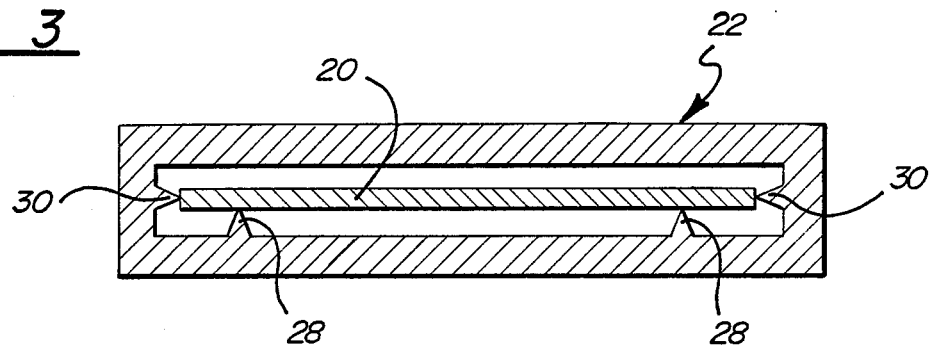
FIG. 3 is a cross-sectional view taken along lines 3—3 of FIG. 1.

In order to transport the substrates 20 from the load chamber 12, through the etching chamber 14, and to the unload chamber 16, the system 10 further includes a transport means. The transport means preferably is at least partly formed by guide rails 26 within the etching chamber 14 as best seen in FIG. 2 and bottom and side guide protrusions 28 and 30 within the channels of the gas gates 20 and 22 as best seen in FIG. 3. The guides 28 and 30 serve to properly position the substrates within the gas gate channels so that they are spaced from the bottom wall thereof to permit gas flow on both sides of the substrates. The protrusions 28 and 30 also align the substrates together with the guide rails 26 so that the substrates can physically push each other through the system under the force of any suitable pushing mechanism, such as pushing mechanism 31 illustrated within the load chamber.

The transport means of the system 10 is thus particularly suited for transporting substrates which are formed from a rigid material such as glass. The glass edges can be coated with any suitable coating or material to preclude chipping of the substrate edges. However, flexible substrates can also be transported if they are mounted in a suitable rigid carrier or frame which provides the support for the substrates at their peripheral margins. Such frames could also include linking means for detachably linking the frames together. Hence a chain of substrates would result which, if desired, could be pulled through the system by a suitable pulling mechanism 33 within the unload chamber 16 or alternatively, which could be pushed by the pushing mechanism 31 at one end and pulled by the pulling mechanism 33 at the other. Either such arrangement would find utility even for rigid substrates. In addition, each frame could be used to support a group of substrates to allow a plurality of substrates to be processed at one time.

Figure 6:
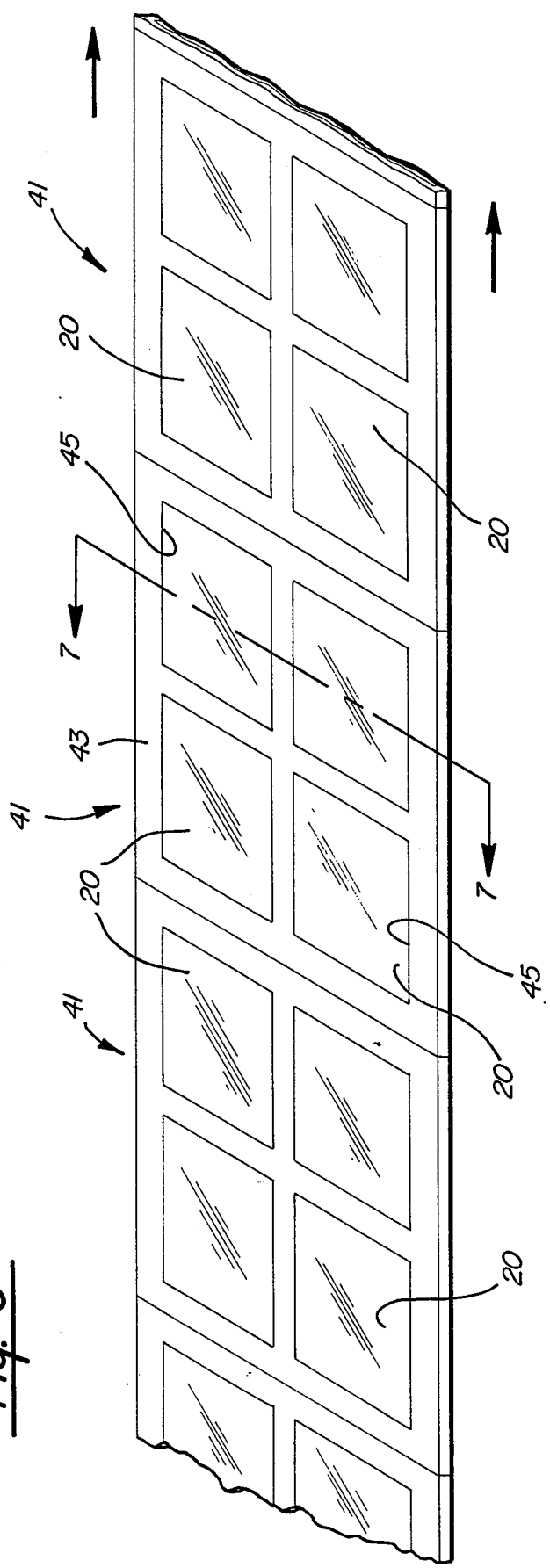
FIG. 6 is a partial perspective view of a substrate carrier which can be utilized in practicing the present invention.
Figure 7:
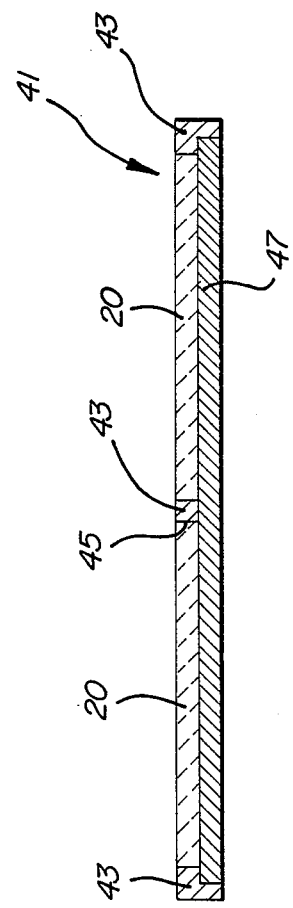
FIG. 7 is a cross-sectional view taken along lines 7—7 of FIG. 6.

FIGS. 6 and 7 illustrate a frame or carrier 41 adapted to support a plurality of substrates 20. FIG. 6 also illustrates a plurality of the frames 41 in side-by-side series relation as they would be disposed when being advanced through the system 10 of FIG. 1. Such side-by-side relation could result from the carrier being pushed through the system as mentioned above or from the carriers being latched together by a mechanism (not shown) and pulled through the system. Each carrier as illustrated is arranged to support four substrates. As best seen in FIG. 7, the carriers include a bottom metal support plate 47 which carries a top frame forming structure 43 which can be formed from a polymer material such as a polyaryl ether sold under the tradename "Ardel" by Union Carbide. The frame structure 43 defines a plurality of openings 45 each dimensioned for receiving one of the substrates therein. As a result, the carrier 41 permits a plurality of substrates 20 to be processed at one time.

The etching chamber 14 includes means for forming a reactive ion etch glow discharge plasma from at least one etching process gas. To that end, the etching chamber 14 includes a main electrode or cathode 32 preferably formed from aluminum and a counter electrode 34. The counter electrode 34 is illustrated in dashed lines since, in many applications and systems, the top cover 14a of the etching chamber 14 would be arranged to form the counter electrode. As can be noted in FIG. 2, the substrate 20 is guided over the main electrode 32 between it and the counter electrode. As further illustrated in FIG. 2, the bottom surface of the main electrode 32 is coated with a layer 35 of protective material which is substantially impervious to the dry etching process and thus protects the electrode 32 from erosion during the etching process. The protective layer 35 can be formed from a polymer such as a polyaryl ether sold under the tradename "Ardel" by Union Carbide.

To form the glow discharge plasma, the cathode 32 is coupled at a terminal 36 to a source of RF energy (not shown) such as an RF transmitter having an output frequency of 13.58 megahertz, for example. The etching chamber 24 etches material from the substrates 20 by utilizing a glow discharge plasma formed from an appropriate etching process gas, such as carbon tetrafluoride ($CF_4$) or sulfur hexafluoride ($SF_6$) which is fed to the chamber 24 from the load and unload chambers 12 and 16 and through the gas gates 22 and 24 respectively. As can be noted in FIG. 1, the load and unload chambers 12 and 16 each include gas input means 42 and 46 respectively through which at least one etching process gas is fed into these chambers. The etching process gases mentioned above for reactive ion etching, namely carbon tetrafluoride and sulfur hexafluoride, have such high disassociation energies that they are relatively inert prior to disassociation. Hence the substrates 20 present in load chamber 12 or unload chamber 16 would not be contaminated by the process gas (or gases) introduced into chamber 12 or chamber 16.

During the operation of the system 10, the interior of each of the chambers 12, 14, and 16 is maintained at or within a preselected partial vacuum pressure or pressure range. Accordingly, the interior volumes of chambers 12, 14, and 16 of system 10 are constructed to be and maintained during operation as a closed system. To that end, the system 10 includes pressure control means including at least one absolute pressure control pump 40, which is associated with etching chamber 14. The absolute pressure control pump maintains a desired pressure within the chamber 14 of about 1 Torr or less to enable the establishment of the glow discharge plasma within the etching chamber 14. Preferably, however, the system 10 especially the gas gates 22 and 24 are designed so that only one pump, namely pump 40, is required. The desired pressure or pressures in chambers 14 and 16 may be initially obtained or maintained at least in part with separate absolute pressure control pumps 40a and 40b respectively if desired. In accordance with the present invention, the absolute pressure control pump 40 maintains a pressure within the etching chamber 14 which is lower than the pressure maintained within the load chamber 12 and the unload chamber 16. This causes the etching process gas or gases fed into the chambers 12 and 16 to flow through the gas gates 22 and 24 into to the etching chamber 14 to facilitate the forming of the plasma therein. It also maintains a unidirectional gas flow of the at least one etching process gas from the load chamber 12 and the unload chamber 16 into the etching chamber 14 as indicated by the arrows 62 and 64. The unidirectional gas flow into the etching chamber 14 serves to isolate the excited species formed from the disassociation of the process gas (or gases) within the etching chamber 14 from the interior of the load chamber 12 and the unload chamber 16. As previously mentioned, the etching process gases are not contaminating until disassociated. Hence, the process gases serve both to enable the formation of the reactive ion etch glow discharge plasma within the etching chamber and to provide isolation of its own disassociated active species. This arrangement and method minimizes the number of different process gases required in practicing the present invention.

However, those in the art will appreciate that inert gases such as argon may be supplied to chamber 12 or chamber 16 or both, instead of the process gas or gases to be disassociated in etching chamber 14. If one of the chambers 12 or 16 is provided with an inert gas, the plasma etching environment within chamber 14 can be sustained by the process gases fed to the other chamber 12 or 16. If both chambers 12 and 16 are supplied with an inert gas instead of the process gas or gases, the etching chamber could be provided with a separate gas input means for feeding the process gas or gases to the etching chamber 14. With any of the above alternative arrangements, the inert gas can be utilized to provide isolation of the disassociated active species within the etching chamber 14 from the chamber or chambers provided with the inert gas.

In order to optimize the efficiency and throughput of the system 10, the load chamber 12 and unload chamber 16 are detachable from the etching chamber 14 at the flanges 48 and 50 of the gas gates 22 and 24. As a result, when all of the substrates 20 from the load chamber 12 have been transferred to the unload chamber 16, valves 52 and 54 can be closed to enable the load chamber 12 to be disconnected from the etching chamber 14 without necessitating exposing the etching chamber 14 to ambient pressure or atmosphere conditions. A similar load chamber having substrates stored therein can then be connected to the etching chamber 14 and then the valves 52 and 54 can once again be opened to initiate a new run of substrates through the system.

Similarly, when the unload chamber 16 has been filled with substrates to its capacity, valves 56 and 58 can be closed to facilitate the removal of the unload chamber 16 from the etching chamber 14. Once an empty unload chamber is connected to the etching chamber 14, the valves 56 and 58 can once again be opened to initiate the deposition process. This can be accomplished without necessitating the interruption of the glow discharge plasma within the etching chamber 14 since there could always be a supply of process gas from one of the chambers 12 or 16.

In operating the system 10 of FIG. 1, a load chamber 12 which is fully loaded with substrates 20 to be processed is connected to the etching chamber 14. Similarly, an empty unload chamber 16 is connected to the etching chamber 14. The valves 52, 54, 56, and 58 are opened. Prior to making these connections, the load and unload chambers are preferably purged one or several times with an inert gas in order to substantially eliminate the ambient atmosphere introduced into these chambers while substrates are inserted or removed from the chambers. This helps avoid contaminating the etching chamber 14. The load and unload chambers are also preferably pumped down to or near the desired vacuum level. If desired or necessary, the etching chamber may be purged once or several times using an inert gas, also. The pump 40 is activated to initially pump down chamber 14 to an appropriate partial vacuum pressure and the etching process gas or gases are introduced. Then, radio frequency energy is fed to the main electrode 32 at terminal 36 while the etching process gas is continuously fed at controlled rates into the inputs 42 and 46. After the system has stabilized at the desired chamber pressures and gas flow rates, the substrates can be fed into the etching chamber. To maintain uniform flow rates of sweep gases from chambers 12 and 16 into etching chamber 14, it is preferable to use employ or dummy substrates for the first few substrates and the last few substrates during one continuous succession or run of substrates through the system.

During the operation of the system, it is necessary to both maintain a suitable environment within the etching chamber to sustain the reactive ion etching process and maintain suitable gas gate conditions including the gas flow rate through the gas gates to provide the degree of isolation desired or required. As previously mentioned, as disclosed in U.S. patent application Ser. No. 760,305 which has been incorporated herein by reference, the degree of isolation is dependent upon the gas flow rate within the gas gates, the length of the gas gates, the cross-sectional area of the gas gates, the pressure within the gas gates, and the diffusion coefficient, which is the measure of how fast one gas moves through another gas at a certain pressure and temperature. As further disclosed therein, the gas flow rate through the gas gates, the average pressure within the gas gates, and the gas gate dimensions are all interdependent and an expression is provided which correlates these parameters to render a gas gate constant (G) which can be utilized to predict the degree of isolation obtainable for a given set of operating conditions.

In order to both sustain the reactive ion etch process and achieve a certain degree of isolation, it is first necessary to establish the reactive ion etching process parameters and then determine the other process parameters in relation thereto to obtain the anticipated degree of isolation.

In accordance with this preferred embodiment, to etch amorphous silicon alloy materials with pure $CF_4$ gas, and not by way of limitation, the gas gates can have the dimensions of 16 inches in width, 10 inches in length, and ¼ inch in height. The etching chamber is preferably operated at a pressure of about 20 mTorr to 200 mTorr and preferably 40 mTorr and the load and unload chambers can each be operated at a pressure slightly above the pressure of the etching chamber depending on the gas flows, for example, 45–50 mTorr for an etching chamber pressure of 40 mTorr. Process gas flow rates into the load chamber and unload chamber through their respective inputs can be 50 SCCM each (for a total of 100 SCCM being supplied to the etching chamber). The RF power applied to the main electrode can be between about 0.2 watt to 0.5 watt per square centimeter of the substrate area and the main electrode can be biased with a DC bias in the range between −300 and −400 volts, and preferably −360 volts.

With the above noted process parameters a suitable degree of isolation can be obtained for practicing the present invention. More specifically, the ratio of the concentration of the active species within the etching chamber 14 to the concentration of those species within the load chamber 12 and unload chamber 16 immediately adjacent thereto will be greater than 100:1. This is adequate for most applications. For applications requiring greater isolation, such as a ratio of 1000:1 or more, flow rates, load and unload chamber pressures, and the like can readily be suitably adjusted or otherwise arranged to obtain same by those skilled in the art.

A preferred method of etching amorphous silicon alloy materials involves using a metal mask instead of a traditional organic photoresist mask as a precaution against possible contamination of the side walls of the mesa structures or devices being formed during the reactive ion etching processing. This method is fully explained in the aforementioned U.S. Pat. No. 4,680,085, and thus need not be further described here. When this method is used with the present invention, it should help ensure that the devices in the load or unload chamber are not subject to any unnecessary contamination due to chemical breakdown or vaporization of the organically-based photoresist.

In addition to the foregoing, a separate sweep gas feed means could be utilized for providing the sweep gas to the gas gates 22 and 24 from the load and unload chambers, respectively. Such a separate sweep gas feed means could be employed in the load and unload chambers 12 and 16 immediately adjacent the gas gates 22 and 24 respectively and arranged for directing the sweep gas directly into the gas gates. The sweep gas so provided could be the etching process gas or gases, an inert gas, or mixtures thereof. If the sweep gas separately provided by the separate sweep gas feed means includes sufficient flow of the etching process gas or gases, the gas input means 42 and 46 of chambers 12 and 16 respectively can be omitted.

From the foregoing, it can be seen that the present invention provides a new and improved system and method for reactive ion etching an etchable material from a substrate. The present invention provides such a system and method which is a continuous process wherein etching uniformity in only one direction need be considered. Sufficient isolation is provided between the chambers by the same gases which form the plasma to minimize the number of gases required. The system and method of the present invention also lends itself to mass production of substrates, and particularly to the making of liquid crystal displays or to other circuit arrays of the type incorporating a plurality of discrete active or passive circuit devices which are formed by one or more layers of etchable material, such as amorphous or microcrystalline silicon alloys. The term "amorphous", as used herein, includes all materials or alloys which have long range disorder, although they may have short or intermediate range order or even contain, at times, crystalline inclusions. Also, as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occur.

Having thus described preferred embodiments of the invention, those in the art should appreciate that various modifications or additions may be made to the preferred embodiments without departing from the scope of the claims below. For example, as is known in the art, reactive ion etching may be used to anisotropically etch various materials used in fabricating semiconductor structures for the electronics industry, as disclosed in the following exemplary U.S. Pat. Nos.

TABLE

| U.S. Pat. No. | Material(s) Etched |
| --- | --- |
| 4,432,132 | crystalline silicon |
| 4,444,617 | molysilicide and polysilicon |
| 4,444,618 | aluminum alloys |
| 4,445,966 | chromium/silicon |
| 4,450,042 | crystalline silicon |
| 4,484,978 | silicon oxide |
| 4,543,320 | silicon oxide and molybdenum |

Although the chemistry and the precise processing parameters used in reactive ion etching typically depends heavily on the morphology and chemical compositions of the structures to be etched, those in the art should readily be able to adapt the system and methods of the present invention to work with various process gases, and processing conditions described in the foregoing list of patents, for example.

In a similar manner, the continuous processing system and methods of the present invention may be readily adapted to perform various other known dry etching techniques using any conventional or suitable process gas or combination of process gases. Several of these dry etching processes involving glow discharge or wide-area ion beams have been specifically mentioned earlier herein. Some of these such dry etching techniques, such as reactive ion beam etching and chemically assisted ion milling are particularly suitable anisotropically etching a wide variety of materials including insulators (e.g., oxides and nitrides) as well as metals, metal alloys and various semiconductors.

Figure 5:
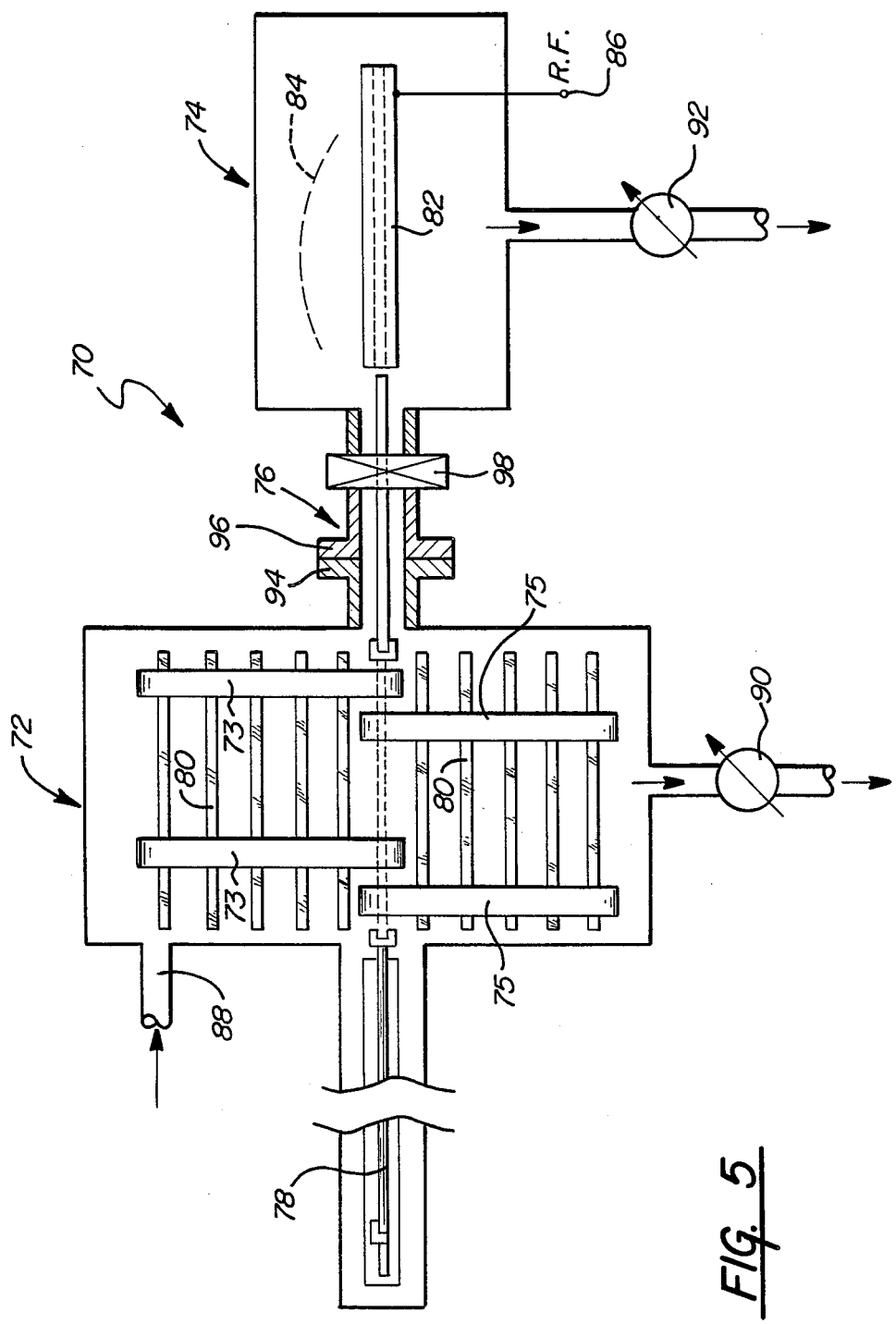
FIG. 5 is a generally schematic side view of another etching system embodying the present invention.

Referring now to FIG. 5, it illustrates another system 70 which embodies the present invention. Like the system 10, the system 70 is adapted for etching an etchable material such as one or more layers of amorphous semiconductor alloy thin films from each of a plurality of substrates 80. The system 10 generally includes a substrate chamber 72 and an etching chamber 74.

The substrate chamber 72 is adapted for both storing a plurality of substrates 80 to be processed and upon which one or more layers of semiconductor material such as amorphous semiconductor alloy material have been deposited and for collecting the substrates which have been processed in the etching chamber 74. Hence, the substrate chamber 72 serves the dual purpose of the load chamber 12 and unload chamber 16 of the system 10 of FIG. 1. To that end, the substrate chamber 72 includes two sets of belts 73 and 75. The belts 73 support the substrates to be processed and the belts 75 support the substrates which have been processed. The belts can be similar in structure and function as previously described with respect to the system 10 of FIG. 1 and therefore need not be further described in detail herein.

The etching chamber 74 can be adapted to provide any of the dry etching processes previously referred to using any conventional or suitable process gas or combination of process gases. Preferably, the etching chamber 74 is adapted to form an etching plasma therein for reactive ion etching the exposed areas of the semiconductor thin films on the substrate 80.

The chambers 72 and 74 are coupled together by a coupling means or gas gate 76 which couples the substrate chamber 72 to the etching chamber 74. The gas gate 76 is dimensioned to permit the substrates 80 to pass therethrough as illustrated in FIG. 5 so that the substrates can be shuttled between the chambers 72 and 74. As in the previous embodiment, the gas gate 76 is also dimensioned for conducting the unidirectional gas flow therethrough to provide efficient isolation between the chambers.

In order to transport the substrates 80 between the substrate chamber 72 and the etching chamber 74 through the gas gate 76, a mechanism 78 can be used which both pushes the substrates from the belts 73 of the substrate chamber 72 into the etching chamber 74 and pulls the processed substrates from the etching chamber 74 back to the belts 75 of the substrate chamber 72. Again, guides (not shown) can be employed to properly position the substrates within the gas gate channel so that they are spaced from the bottom wall thereof to permit gas flow on both sides of the substrates.

To form a reactive ion etch glow discharge plasma within the etching chamber 74 from at least one etching process gas, the etching chamber 74 includes a main electrode or cathode 82 and a counter electrode 84. The counter electrode 84 is again illustrated in dashed lines. The cathode 82 is coupled at a terminal 86 to a source of RF energy (not shown) which again can be an RF transmitter having an output frequency of 13.58 megahertz, for example. The etching process gas used to form the etching glow discharge plasma within the etching chamber 74 can again be carbon tetrafluoride ($CF_4$) or sulfur hexafluoride ($SF_6$) and fed to the chamber 74 from the substrate chamber 72 through the gas gate 76. The substrate chamber 72 has a gas input 88 through which the etching process gas is fed into the substrate chamber 72. As disclosed previously, the input 88 can alternatively receive an inert gas, such as argon, and the etching chamber 74 can be separately provided with the etching process gas through an input (not shown).

The interior of each of the chambers 72 and 74 is maintained at a partial vacuum pressure by absolute pressure control pumps 90 and 92 associated with substrate chamber 72 and etching chamber 74 respectively. The absolute pressure control pumps maintain pressure within the etching chamber 74 which is lower than the pressure maintained within the substrate chamber 72 to cause the etching process gas or gases fed into the substrate chamber 72 to flow through the gas gate 76 into the etching chamber 74 to facilitate the forming of the plasma therein. It also maintains the unidirectional gas flow of the etching process gas from the substrate chamber 72 into the etching chamber 74 to isolate the etching chamber 74 from the substrate chamber 72.

The substrate chamber 72 is also preferably constructed so as to be detachable from the etching chamber 74 at the flanges 94 and 96 of the gas gate 76. When all of the substrates 80 have been processed, the valve 98 can be closed to enable the substrate chamber 72 to be disconnected from the etching chamber 74 without necessitating exposing the etching chamber 74 to ambient pressure. A similar substrate chamber having substrates stored therein to be processed can then be connected to the etching chamber 74, and then the valve 98 can once again be opened to initiate a new run of substrates.

In operating the system 70 of FIG. 5, a substrate chamber 72 which is fully loaded with substrates to be processed is connected to the etching chamber 74. After the substrate chamber 72 has been purged of any undesirable gases or contaminants, filled with a suitable gas, and pumped down nearly to the desired partial vacuum pressure, the valve 98 is opened and the pumps 90 and 92 are activated to pump down chambers 72 and 74 to appropriate partial vacuum pressures required during the processing of the substrates. Then, radio frequency energy is fed to the main electrode 82 at terminal 86 and the at least one etching process gas is fed into the input 88. After the system has stabilized with respect to desired chamber pressures and gas flow rates, the substrates can be advanced into the etching chamber one at a time. After a substrate has been processed in the etching chamber, it is returned to the substrate chamber where upon the next substrate is advanced into the etching chamber. The process parameters previously referred to can be utilized to practice the invention in accordance with this preferred embodiment. If the base metal surface of the cathode 82 is left exposed when the substrate 80 is withdrawn from the etching chamber 74 while the etching plasma is established and the cathode is biased so as to attract reactive ions, this metal surface will be attacked and contamination of the etching chamber could result. Accordingly, in order to avoid this problem, it is preferred to remove the bias from the cathode or extinguish the plasma or both during the time a substrate (or substrate carrier) is being loaded into or unloaded from the etching chamber 74. Alternatively, the top metal surface of powered cathode 82 could be provided with a suitably thin coating of, for example, the Ardel polymer earlier mentioned to substantially eliminate the contamination problem. The coating should not be so thick as to significantly impede the ability to capacitively couple the substrate to be etched and the cathode by applying a suitable level of DC bias to the cathode.

As earlier mentioned, in order to achieve isolation between the etching chamber and the load or unload chamber in the system of the present invention, it is necessary to maintain laminar flow (which is also known as viscous flow) in the sweeping or gas flowing through the gas gate. To achieve laminar flow requires the maintenance of certain minimum pressure differentials and gas flow rates through the gas gates, the specific values of which depend to a large degree upon the precise configuration, geometry and length of the gas gates, and diffusion coefficients of the gases to be isolated. Generally, laminar flow is difficult to achieve in gas gates of practical height and width, regardless of the gate length, chamber pressures of 10 mTorr or less. Accordingly, those in the art will appreciate that for dry etching processes carried out at very low pressures, it may not be possible to obtain isolation. Thus, for example, if process chamber pressure for a certain ion milling operation is so low that only a molecular gas flow regime or a Knudsen gas flow regime is obtained through the gas gates, then significant isolation of the chambers by using sweep gases to prevent back diffusion will not be achieved. However, to the extent that etching chamber pressures are sufficiently high to allow laminar flow to be established, then the apparatus of the present invention can indeed be used to obtain significant isolation or prevention of back-diffusion by the use of gases which sweep through the gas gates.

It should be appreciated that the systems of the present invention are still advantageous even when isolation between the chambers is not maintained, since they allow for either continuous feeding of the substrates (as in FIG. 1) or for successive feeding of the substrates without opening and closing load locks.

In light of the foregoing comments, as to some of the various modifications of the present invention which are possible, it is to be understood that the spirit and scope of the present invention is to be limited only by the terms of the appended claims.

I claim:

1. A system for dry etching an etchable material from a substrate, said system comprising:
    an etching chamber including means for establishing a dry etching process therein from a first etching process gas for dry etching said etchable material from said substrate;
    a substrate chamber including means for storing said substrate and means for receiving at least a second gas;
    first coupling means for coupling the interior of said substrate chamber with the interior of said etching chamber to provide a passageway therebetween for said substrate, said passageway being adopted to remain open during the dry etching of said etchable material from said substrate;
    transport means for advancing said substrate from said substrate chamber into said etching chamber through said first coupling means; and
    means for maintaining substantially unidirectional gas flow of said second gas through said first coupling means from said substrate chamber to said etching chamber.

2. A system as defined in claim 1 wherein said substrate chamber is a substrate load chamber;
    said system further comprises a substrate unload chamber including means for receiving at least a third gas, second coupling means for coupling said unload chamber to said etching chamber, and means for maintaining unidirectional gas flow through said coupling means of said third gas from said unload chamber to said etching chamber; and
    said transport means further being adapted for advancing said substrate through said second coupling means from said etching chamber to said unload chamber after said etchable material has been etched from said substrate.

3. A system as defined in claim 2 wherein said means for maintaining unidirectional gas flow include means for maintaining unidirectional flow of said second and third gases at a flow rate to provide a concentration ratio of said etching species from said etching chamber to said load and unload chambers of at least 100.

4. A system as defined in claim 2 wherein one of said second or third gas is an etching process gas.

5. A system as defined in claim 2 wherein said means for maintaining unidirectional gas flow include pressure control means for maintaining said etching chamber at a lower internal pressure than the internal pressure of said load chamber and of said unload chamber.

6. A system as defined in claim 5 wherein said pressure control means comprises a separate pressure control pump coupled to said etching chamber.

7. A system as defined in claim 2 wherein said load chamber includes means for storing a plurality of said substrates and wherein said transport means are arranged for feeding said substrates into said etching chamber one at a time in succession from said load chamber.

8. A system as defined in claim 7 wherein said unload chamber includes substrate collecting means for receiving said substrates from said etching chamber.

9. A system as defined in claim 1 wherein said transport means are adapted to remove said substrate from said etching chamber after said etchable material has been etched from said substrate in said etching chamber.

10. A system as defined in claim 9 wherein said transport means are adapted to return said substrate to said substrate chamber.

11. A system as defined in claim 1 wherein said substrate chamber is a substrate load chamber, and
    said system further comprises a substrate unload chamber, and second coupling means for coupling said substrate unload chamber to said etching chamber to provide a passageway therebetween for said substrate, said passageway being adapted to remain open during the dry etching of said etchable material from said substrate, and wherein
    said transport means being adapted for continuously advancing said substrate from said load chamber into said etching chamber to permit said dry etching process to etch said etchable material and for continuously advancing said substrate from said etching chamber to said unload chamber after said etchable material has been etched from said substrate.

12. A system as defined in claim 1 wherein said etching chamber includes means for establishing a glow discharge based dry etching process selected from the group consisting of plasma etching, reactive ion etching, and sputter etching.

13. A system as defined in claim 12 wherein said dry etching process is reactive ion etching.

14. A system as defined in claim 1 wherein said etching chamber includes means for establishing an ion-beam based dry etching process selected from the group consisting of ion milling, chemically assisted ion milling, and reactive ion beam etching.

15. A system as defined in claim 1 wherein said transport means are arranged for continuously advancing said substrate during the dry etching of said substrate in said etching chamber.

16. A system as defined in claim 1 wherein said means for establishing said dry etching process includes a main electrode adapted to receive radio frequency energy and a counter electrode spaced from said main electrode, and wherein said transport means are arranged to advance said substrate along a path immediately adjacent to said main electrode and between said main electrode and said counter electrode.

* * * * *